United States Patent
Bill et al.

(10) Patent No.: US 7,259,983 B2
(45) Date of Patent: Aug. 21, 2007

(54) PAGE BUFFER ARCHITECTURE FOR PROGRAMMING, ERASING AND READING NANOSCALE RESISTIVE MEMORY DEVICES

(75) Inventors: Colin S. Bill, Cupertino, CA (US); Wei Daisy Cai, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/139,227

(22) Filed: May 27, 2005

(65) Prior Publication Data

US 2006/0268595 A1    Nov. 30, 2006

(51) Int. Cl.
*G11C 11/00*    (2006.01)
(52) U.S. Cl. .................. 365/163; 365/148; 365/189.05; 365/225.7

(58) Field of Classification Search ................ 365/148, 365/163, 189.05, 189.07, 225.7
See application file for complete search history.

(56) References Cited

U.S. PATENT DOCUMENTS

| | | | | |
|---|---|---|---|---|
| 5,768,193 A * | 6/1998 | Lee et al. | ............... | 365/185.25 |
| 5,982,675 A * | 11/1999 | Fujimoto | ............... | 365/189.05 |
| 6,643,213 B2 * | 11/2003 | Perner et al. | .......... | 365/230.06 |
| 6,785,154 B2 * | 8/2004 | Sunaga et al. | ............. | 365/100 |
| 2002/0159286 A1 * | 10/2002 | Sunaga et al. | ............. | 365/100 |
| 2003/0174574 A1 * | 9/2003 | Perner et al. | .......... | 365/230.06 |
| 2006/0268595 A1 * | 11/2006 | Bill et al. | .................... | 365/100 |

FOREIGN PATENT DOCUMENTS

WO    WO 2004/064074 A1 *    7/2004

* cited by examiner

Primary Examiner—Andrew Q. Tran

(57) ABSTRACT

In the present method of programming and erasing the resistive memory devices of a memory device array, upon a single command, high current is provided in both the program and erase functions to program and erase only those memory devices whose state is to be changed from the previous state.

7 Claims, 14 Drawing Sheets

PAGE BUFFER ARCHITECTURE FOR PROGRAMMING, ERASING AND READING NANOSCALE RESISTIVE MEMORY DEVICES

BACKGROUND OF THE INVENTION

1. Technical Field

This invention relates generally to memory devices, and more particularly, to resistive memory device operation.

2. Background Art

FIG. 1 illustrates a type of resistive memory device 30 known as an ion motion resistive memory device. The memory device 30 includes an electrode 32 (for example copper), a copper sulfide layer 34 on the electrode 32, an active layer 36, for example a copper oxide layer, on the layer 34, and an electrode 38 (for example titanium) on the active layer 36. Initially, assuming that the memory device 30 is unprogrammed, in order to program the memory device 30, ground is applied to the electrode 38, while a positive voltage is applied to electrode 32, so that an electrical potential $V_{pg}$ (the "programming" electrical potential) is applied across the memory device 30 from a higher to a lower electrical potential in the forward direction of the memory device 30 (see FIG. 2, a plot of memory device current vs. electrical potential applied across the memory device 30). This potential is sufficient to cause copper ions to be attracted from the layer 34 toward the electrode 38 and into the active layer 36 (A) so that conductive filaments are formed, causing the active layer 36 (and the overall memory device 30) to be in a (forward) low-resistance or conductive state. Upon removal of such potential (B), the ions drawn into the active layer 36 during the programming step remain therein, so that the active layer 36 (and memory device 30) remain in a conductive or low-resistance state.

In the read step of the memory device 30 in its programmed (conductive) state, an electrical potential $V_r$ (the "read" electrical potential) is applied across the memory device 30 from a higher to a lower electrical potential in the forward direction of the memory device 30. This electrical potential is less than the electrical potential $V_{pg}$ applied across the memory device for programming (see above). In this situation, the memory device 30 will readily conduct current, which indicates that the memory device 30 is in its programmed state.

In order to erase the memory device, a positive voltage is applied to the electrode 38, while the electrode 32 is held at ground, so that an electrical potential $V_{er}$ (the "erase" electrical potential) is applied across the memory device 30 from a higher to a lower electrical potential in the reverse direction of the memory device 30. This potential is sufficient to cause copper ions to be repelled from the active layer 36 toward the electrode 32 and into the layer 34 (C), causing the active layer 36 (and the overall memory device 30) to be in a high-resistance or substantially non-conductive state. This state remains upon removal of such potential from the memory device 30.

In the read step of the memory device 30 in its erased (substantially non-conductive) state, the electrical potential $V_r$ is again applied across the memory device 30 from a higher to a lower electrical potential in the forward direction of the memory device 30, as described above. With the active layer 34 (and memory device 30) in a high-resistance or substantially non-conductive state, the memory device 30 will not conduct significant current, which indicates that the memory device 30 is in its erased state. A resistive memory array typically includes a large number of these memory devices 30, each of which can be individually read, programmed and erased.

As will be noted from the above description and FIG. 2, relatively low current is required for reading the state of the memory device 30 (desirable to apply low voltage so as to avoid disturb into another state), while substantially higher currents are required for programming and erasing the device 30. In turn, architecture for proving such high currents is required.

Additionally, typically, in a conventional flash memory array, a two-command approach is undertaken, wherein, upon a first command, a whole page of data is erased, and then upon a second command data is written into the array. It would be desirable to provide an approach wherein, upon a single command, erasing and programming is undertaken on only those the memory devices wherein a change of state is required from the previous state, i.e., those memory devices whose state is not to be changed from the previous state are left in that state and do not undergo an erase or program operation.

Therefore, what is needed is a method of meeting the high current needs in programming and erasing the memory devices of resistive memory devices, meanwhile using a single command and changing the state of only those memory devices wherein a change of state is required.

DISCLOSURE OF THE INVENTION

Broadly stated, the present invention is a method of undertaking an operation on resistive memory devices of an array thereof, the array containing memory devices in different states, comprising determining the desired state of each memory device, determining the state of each memory device, and writing data to only those memory devices wherein the state thereof is different from the desired state thereof.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
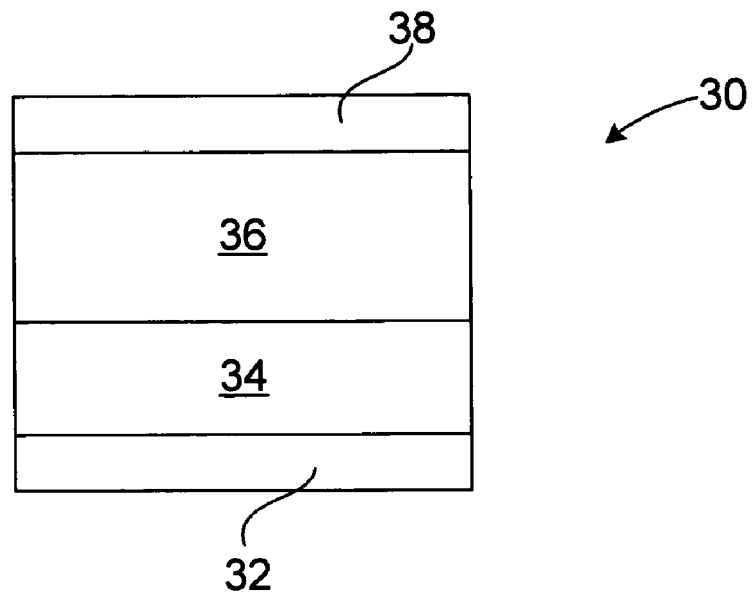
FIG. 1 is a cross-sectional view of an above-described memory device.
Figure 2:
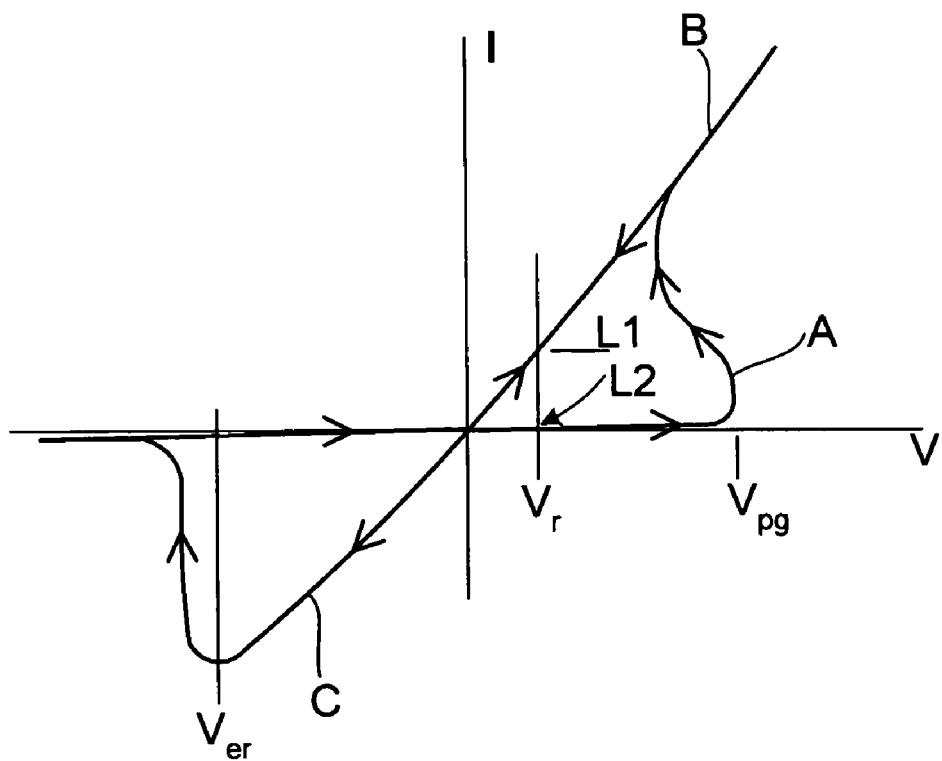
FIG. 2 is a plot of current vs. voltage illustrating operating characteristics of the memory device of FIG. 1.
Figure 3:
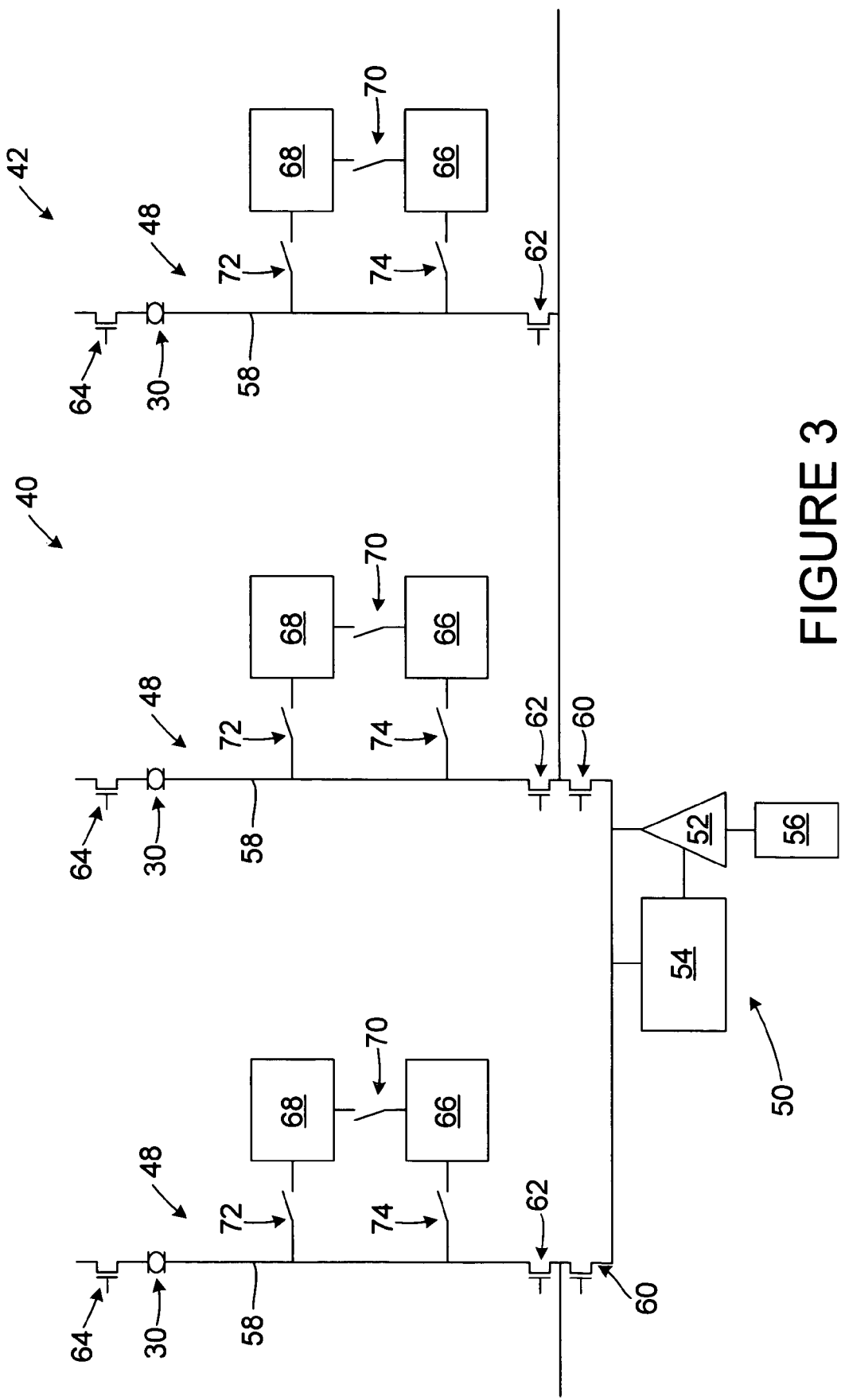
FIG. 3 is a general illustration of the present circuit for practicing the invention.

FIG. 3 illustrates in general form the circuit for practicing the present invention. A portion of a page 40 of a memory array 42 is shown. The page 40 of the memory array 42 includes a plurality of memory structures 48. Circuitry 50 (including write driver 52, circuit logic 54, and an input/output port 56) is in operative association with the page 40 in a manner which will be described.

Each memory structure 48 includes a bit line 58 which may be connected to the circuitry 50 through a y decoder transistor 60 and a y decoder transistor 62. Each bit line 58 has connected thereto along its length a plurality of memory devices 30, each connected in series with an access transistor 64. For the sake of clarity, however, only a single memory device 30 is shown as operatively connected to each bit line 58. Each memory structure 48 also includes a data register 66 in series with a sense latch 68 (connected by a transistor 70 illustrated as a switch), the data register 66 and sense latch 68 being connected in parallel with the bit line 58, by means of a transistor 72 illustrated as a switch connecting the bit line 58 and sense latch 68, and a transistor 74 illustrated as a switch connecting the bit line 58 and data register 66.

Operation of the circuitry will be described with reference to one on the memory structures 48 of FIG. 3, in this example of the middle memory structure 48, although it will be understood that each of the other memory structures 48 operate in a similar manner.

Figure 4:
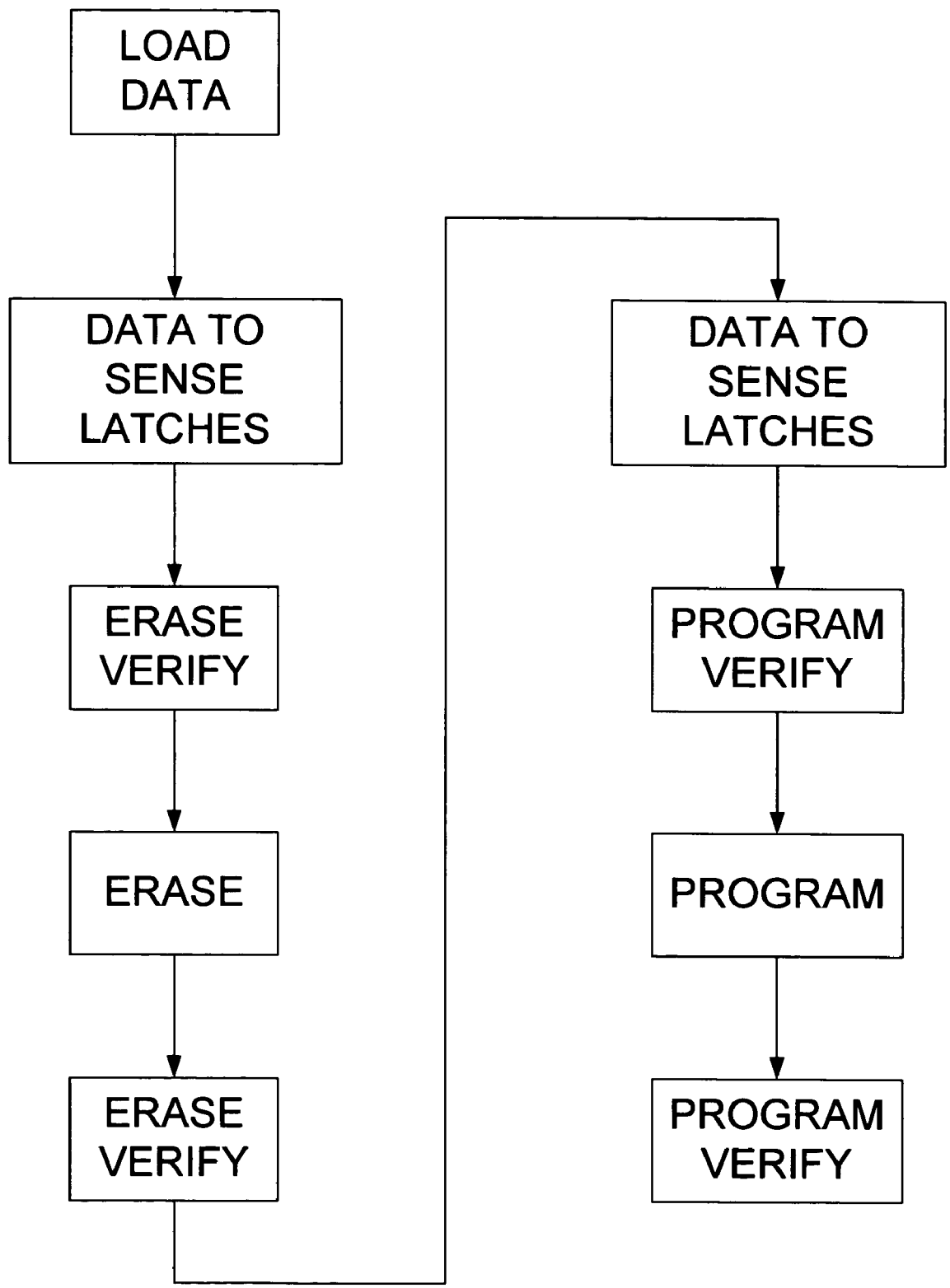
FIG. 4 is a flow diagram illustrating steps in the present method.

Initially, as described above, memory device 30 may be in a high resistance (program "1") state or in a low resistance (program "0") state. Also referring to FIG. 4, with switch 74 closed and switches 70, 72 open, data is loaded byte by byte from the input/output port 56 through the y decoder transistor 62 and into the data register 66. This data is indicative of the desired state of the memory device 30A. Then, switch 70 is closed, and data in the data register 66 is dumped (whole page) to the sense latch 68. Next, an erase verification step is undertaken, in effect comparing the data in the sense latch 68 with the data in the memory device 30, to determine whether an erase step of the memory device 30 needs to be undertaken (whole page). That is, for example, if the memory device 30 is in an erased state (logic 1), and the desired state of the memory device 30 is the erased state (logic 1), an erase step for the memory device 30 is not needed and is not to be undertaken. Likewise, if the memory device 30 is in a programmed state (logic 0), and the desired state of the memory device 30 is the programmed state (logic 0), an erase step is not to be undertaken. If the memory device 30 is in an erased state (logic 1) and the desired state of the memory device 30 is the programmed state (logic 0), an erase step is not to be undertaken (a program step to be undertaken, which will be described later). Finally, if the memory device 30 is in a programmed state (logic 0) and the desired state of the memory device 30 is the erased state (logic 1), an erase step is to be undertaken. With switch 72 closed and switches 70, 74 open, information as to the necessity of undertaking an erase step is provided from the sense latch 68 through switch 72 and through the y decoder transistor 62 and y decoder transistor 60 to logic 54, which provides information to the write driver 52, based on the state of the sense latch 68, to provide an erase current through the memory device 30 in that situation where it is desired (see above). Then, another erase verify step is undertaken through communication of the memory device 30 with the sense latch 68, and the state of the sense latch 68 indicates whether the erase step has been undertaken successfully. If an erase step is desired and this erase verification step has indicated that an erased state has not been achieved, the erase step is repeated and other erase verification step is undertaken, until erase verification indicates that the erase step has been effective.

Next, a program verification step is undertaken, comparing the data in the sense latch 68 with the data in the memory device 30, to determine whether a program step of the memory device 30 needs to be undertaken. That is, for example, if the memory device 30 is in an erased state (logic 1), and the desired state of the memory device 30 is the erased state (logic 1), a program step is not needed and is not to be undertaken. Likewise, if the memory device 30 is in a programmed state (logic 0), and the desired state of the memory device 30 is the programmed state (logic 0), a program step is not to be undertaken. If the memory device 30 is in an erased state (logic 1) and the desired state of the memory device 30 is the programmed state (logic 0), a program step is to be undertaken. Finally, if the memory device 30 is in a programmed state (logic 0) and the desired state of the memory device 30 is the erased state (logic 1), a program step is not to be undertaken. Information as to the necessity of undertaking a program step is provided from the sense latch 68 through switch 72 and through the y decoder transistor 62 and y decoder transistor 60 to logic 54, which provides information to the write driver 52, based on the state of the sense latch 68, to provide a program current through the memory device 30 in that situation where it is desired (see above). Then, another program verification step is undertaken through communication of the memory device 30 with the sense latch 68, and the state of the sense latch 68 indicates whether the program step has been undertaken successfully. If a program step is desired and this program verification step has indicated that a programmed state has not been achieved, the program step is repeated and another program verification step is undertaken, until program verification indicates that the programming step has been effective.

FIG. 5-15 illustrate in detail the circuitry of FIG. 3. As shown, four memory structures 48$_1$, 48$_2$, 48$_3$, 48$_4$ are illustrated, although it will be understood that a very large number of such memory structures are included in the sector 46. Each memory structure 48 includes data register 66, sense latch 68, and transistors 70, 72, 74 all as described above. In each memory structure 48, sensing circuitry 80, including transistors 82, 84, 86, 88 in series, communicates with associated bit line 58 through transistor 90, and with the associated sense latch 68 as shown.

Figure 5:
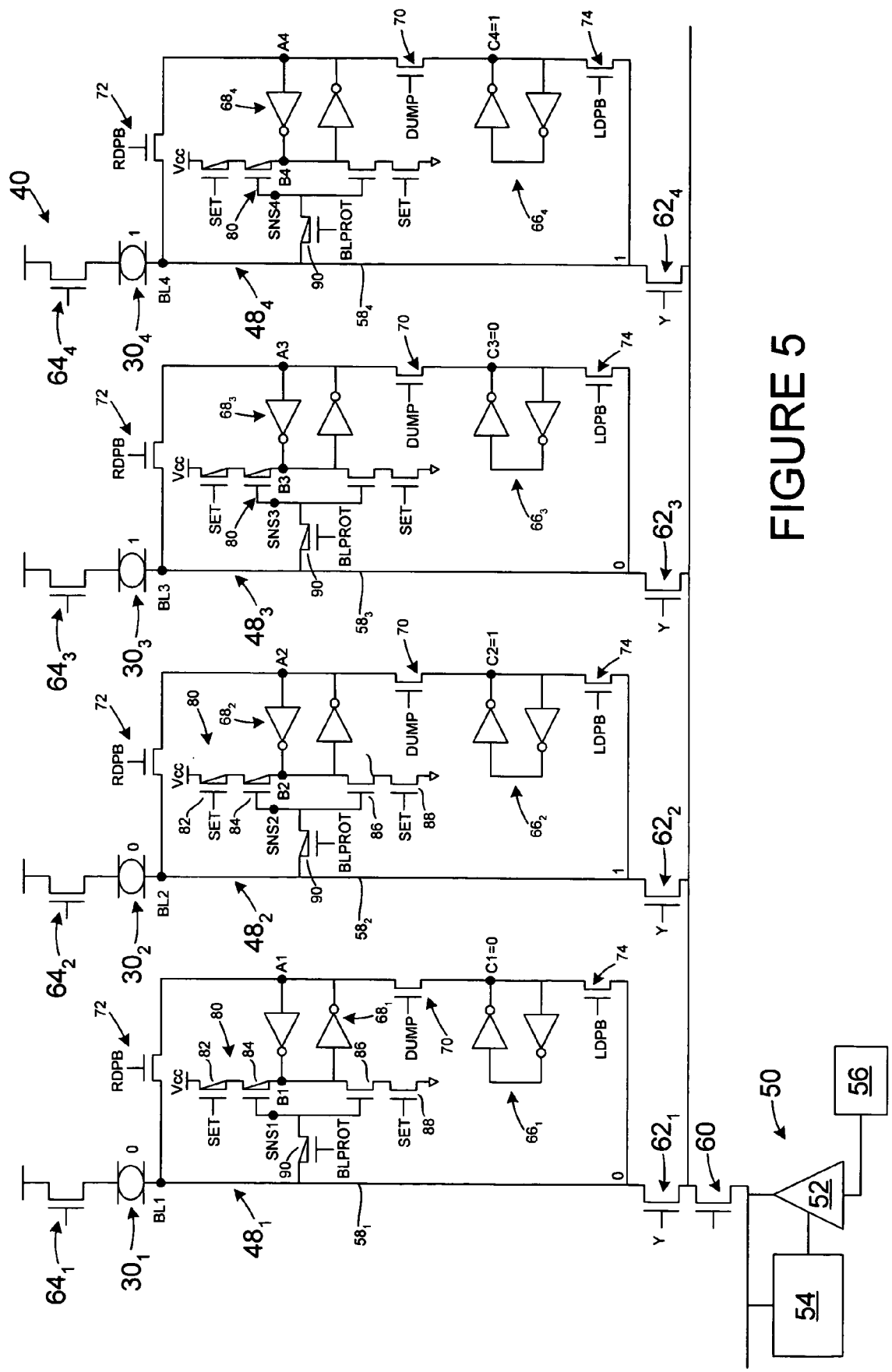
FIGS. 5-15 illustrate in detail the schematic of the circuit of FIG. 3 for use in practicing the present invention, along with the steps of that method.
Figure 6:
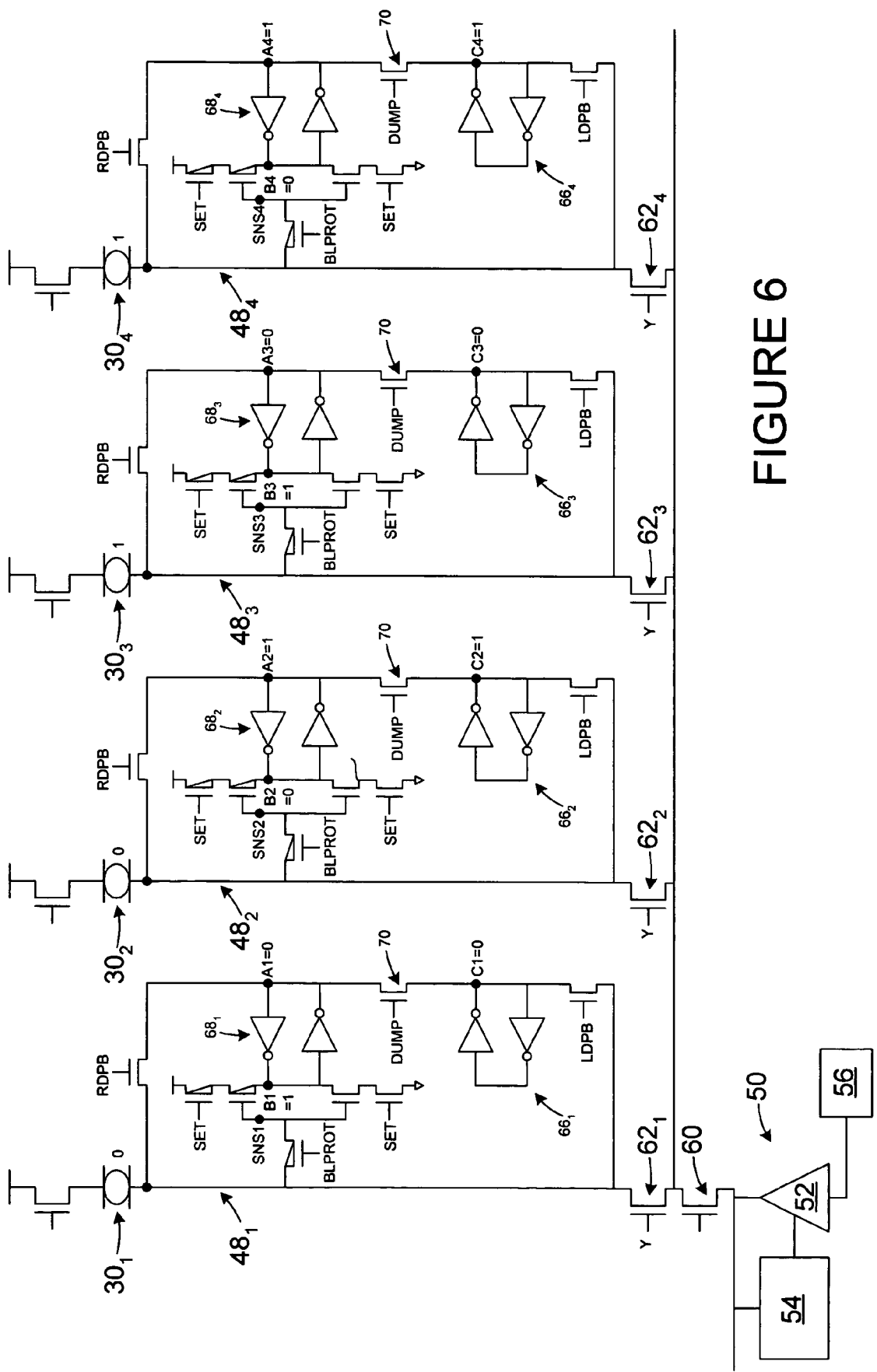

In the present example, in order to illustrate the method, the memory devices 30$_1$, 30$_2$, 30$_3$, 30$_4$ are initially shown as in the low resistance (0), low resistance (0), high resistance (1), high resistance (1) states respectively. Meanwhile, the desired states of the memory devices are to be low resistance (0), high resistance (1), low resistance (0), high resistance (1) respectively. Initially, with LDPB high and with DUMP low and RDPB low, data bits (0101) are provided successively through y decoder transistor 60 and Y decoder transistors 62$_1$, 62$_2$, 62$_3$, 62$_4$ to the respective data registers 66$_1$, $66_2$, $66_3$, $66_4$, so that nodes C1, C2, C3, C4 of the data registers $66_1$, $66_2$, $66_3$, $66_4$ are in the 0101 states respectively (FIG. 5). Then (FIG. 6), the inputs to the transistors 70 are simultaneously taken high (DUMP high), so that the information on each nodes C is provided to the associated sense latch, so that the state of the node A of the sense latch is the same as the state of the node C of the associated data register. That is, the nodes A1, A2, A3, A4 are in the 0101 states respectively. Meanwhile, each node B of a sense latch will be in state opposite to the associated node A, i.e., the nodes B1, B2, B3, B4 will be in the 1010 states respectively.

Figure 7:
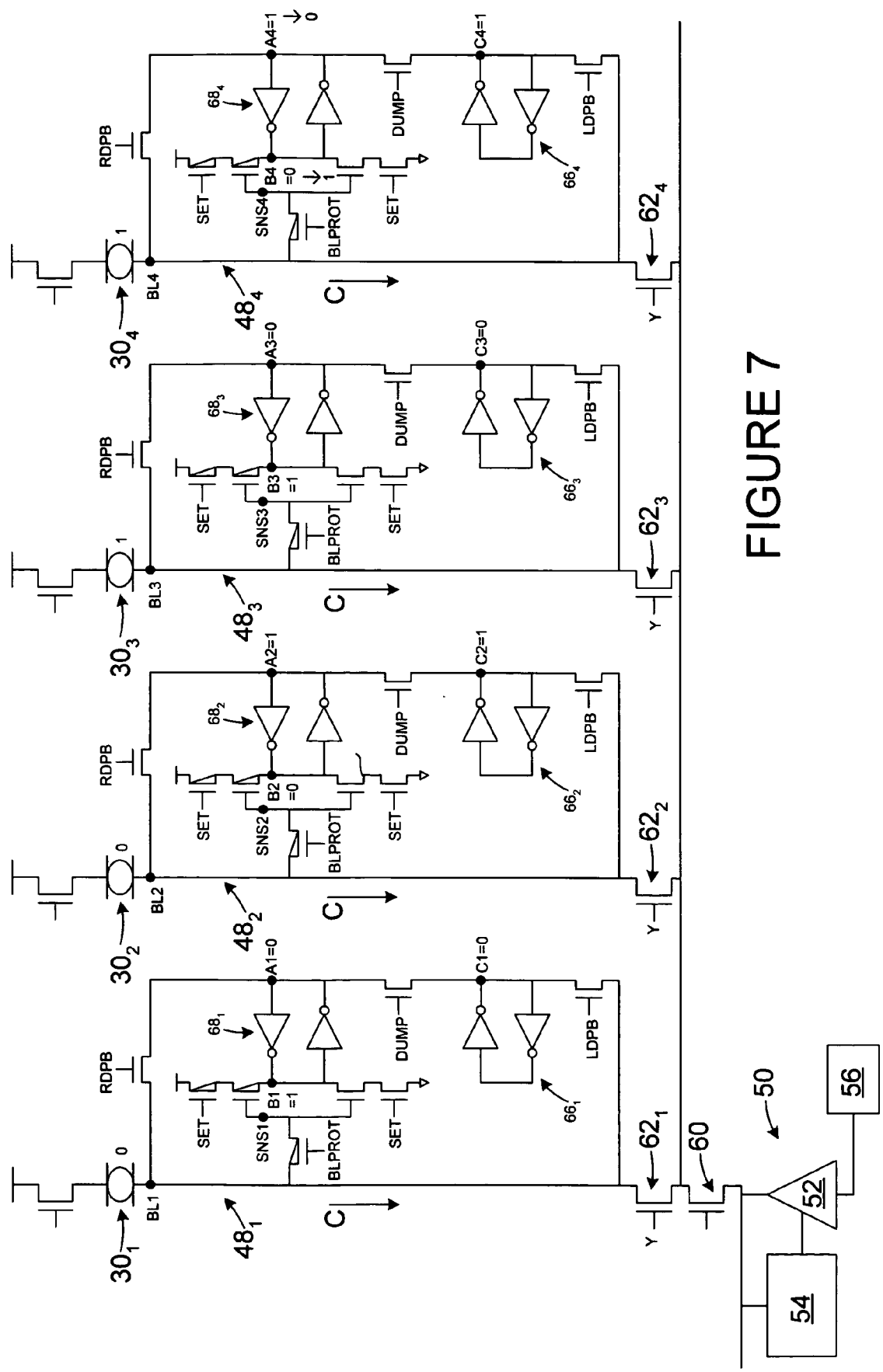
Figure 8:
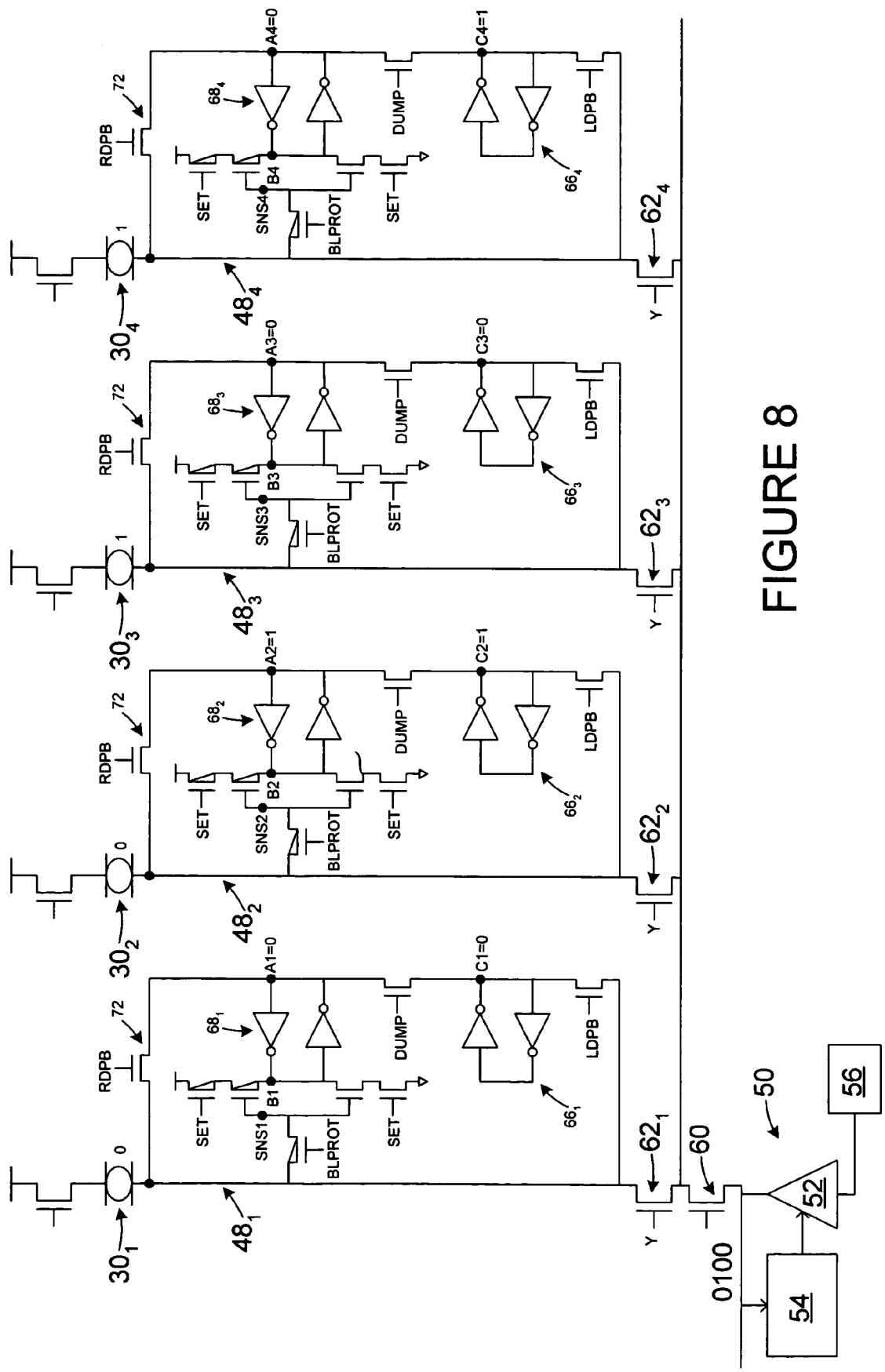

Next, and referring to FIG. 7, an erase verify step is undertaken, wherein BLPROT is low, SET is low, and RDPB, DUMP, and LDPB are all low. With the y decoder transistors $62_1$, $62_2$, $62_3$, $62_4$ on, a read current is driven through each of the memory devices $30_1$, $30_2$, $30_3$, $30_4$, and, depending on the resistance thereof, the respective nodes BL1, BL2, BL3, BL4 (and nodes SNS1, SNS2, SNS3, SNS4) will be either high or low. In the particular situation illustrated, because of the low resistance of the memory devices $30_1$, $30_2$, the nodes BL1, BL2 and SNS1, SNS2 will the high, while because of the high resistance of the memory devices $30_3$, $30_4$, the nodes BL3, BL4 and SNS3, SNS4 will be low. In the memory structure $48_1$, with SNS1 high and SET low, the node B1 will remain in the 1 state. In the memory structure $48_2$, again with SNS high and SET low, the node B2 will remain in the 0 state. In the memory structure $48_3$, with SNS low and SET low, the node B3 will remain in the 1 state. However, in the memory structure $48_4$, with SNS low and SET low, the node B4 will be forced high, i.e., into a 1 state, forcing node A4 thereof into a low or 0 state.

Figure 9:
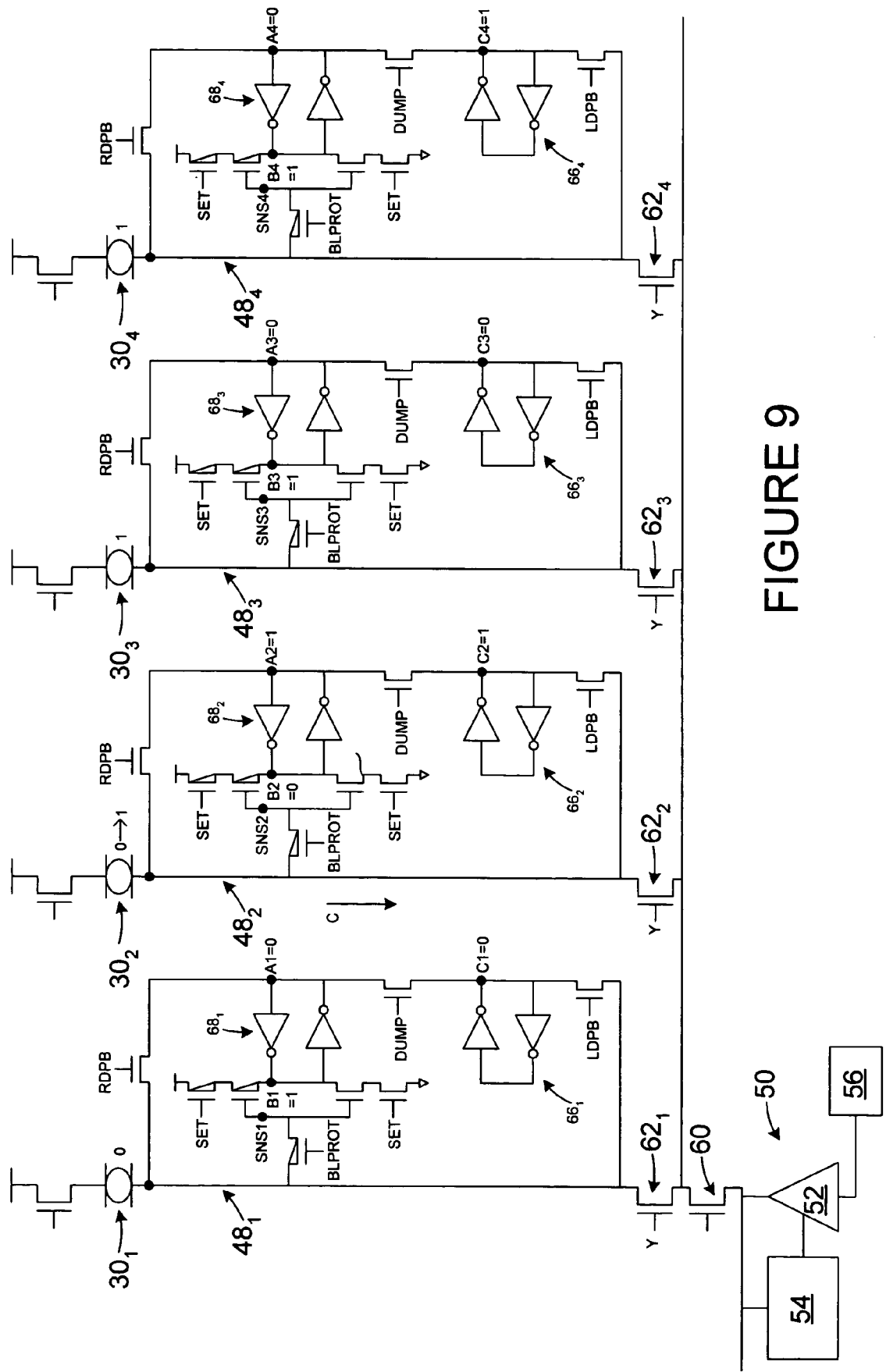
Figure 10:
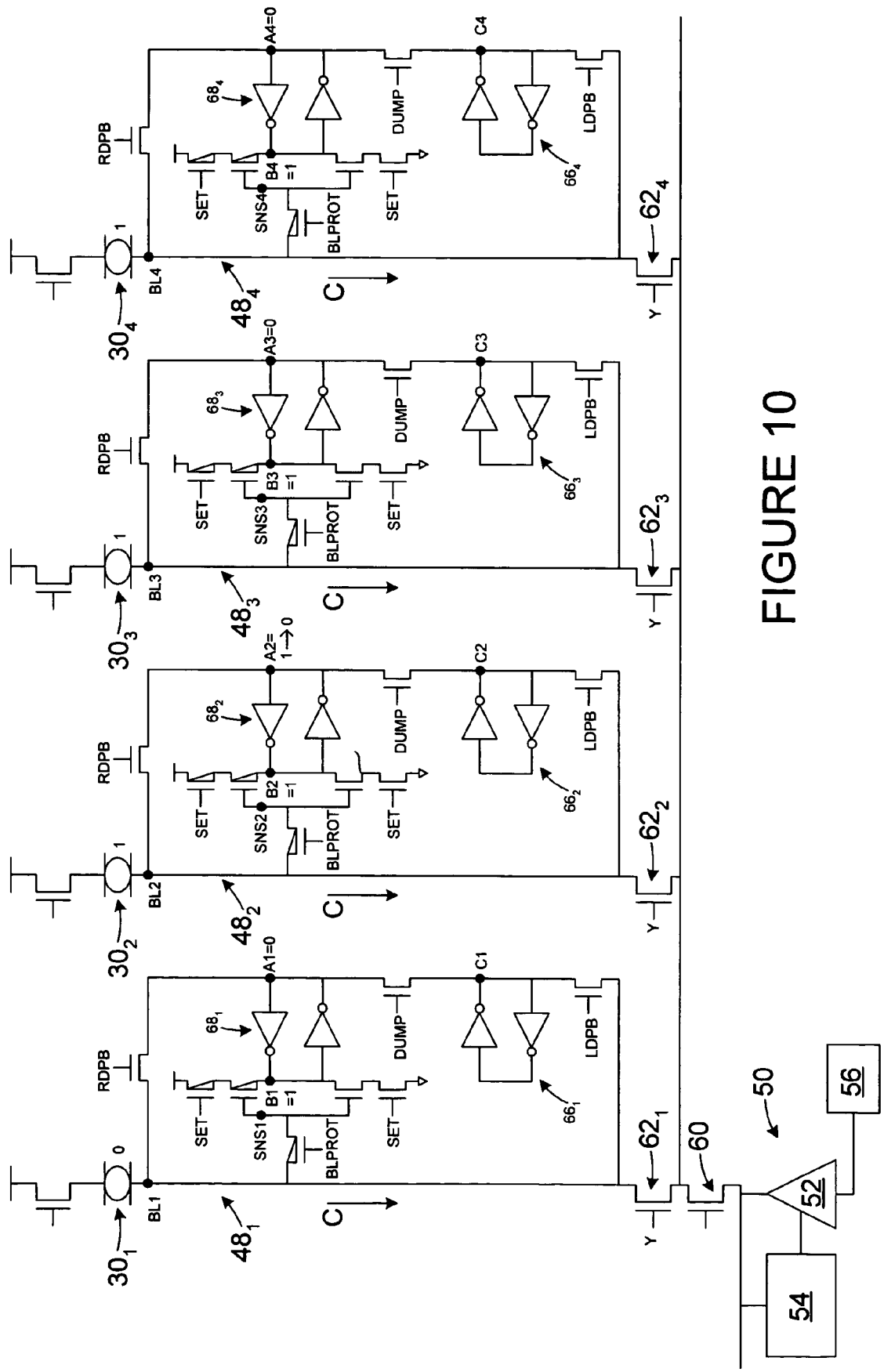

Next (FIG. 8), the signal RDPB is driven high, turning the transistors 72 on, so that the information at nodes A1, A2, A3, A4 of the memory structures $48_1$, $48_2$, $48_3$, $48_4$ is communicated successively through y decoder transistors $62_1$, $62_2$, $62_3$, $62_4$ to the logic 54 in the series 0100. The logic 54 provides information to the write driver 52 to erase only those memory devices wherein the state of the associated node A is 1. In this case, this is only the memory device $30_2$. Then (FIG. 9), with only the Y decoder transistor $62_2$ on, high current is driven by the write driver 52 through the memory device $30_2$ in the proper direction to provide erasing of that memory device $30_2$. As illustrated in FIG. 9, through this operation, the state of the memory device $30_2$ changes from 0 (low resistance) to 1 (high resistance). Meanwhile, the states of the memory devices $30_1$, $30_3$, $30_4$ remained unchanged, so that the states of the memory devices 301, 302, 303, 304 are now respectively 0111.

To complete the erase procedure (FIG. 10), another erase verification step is undertaken wherein BLPROT is low, SET is low, and RDPB, DUMP, and LDPB are all low. With the y decoder transistors $62_1$, $62_2$, $62_3$, $62_4$ on, a read current is driven through each of the memory devices $30_1$, $30_2$, $30_3$, $30_4$, and, depending on the resistance thereof, the respective nodes BL and SNS will be either high or low. Because of the low resistance of the memory device $30_1$, the node BL1 and node SNS1 will the high, while because of the high resistance of memory devices $30_2$, $30_3$, $30_4$, the nodes BL2, BL3 and BL4 and nodes SNS2, SNS3 and SNS4 will be low. All of the nodes A will be in their low state, which information, when provided to the logic 54, confirms that erasing as desired has been achieved.

Figure 11:
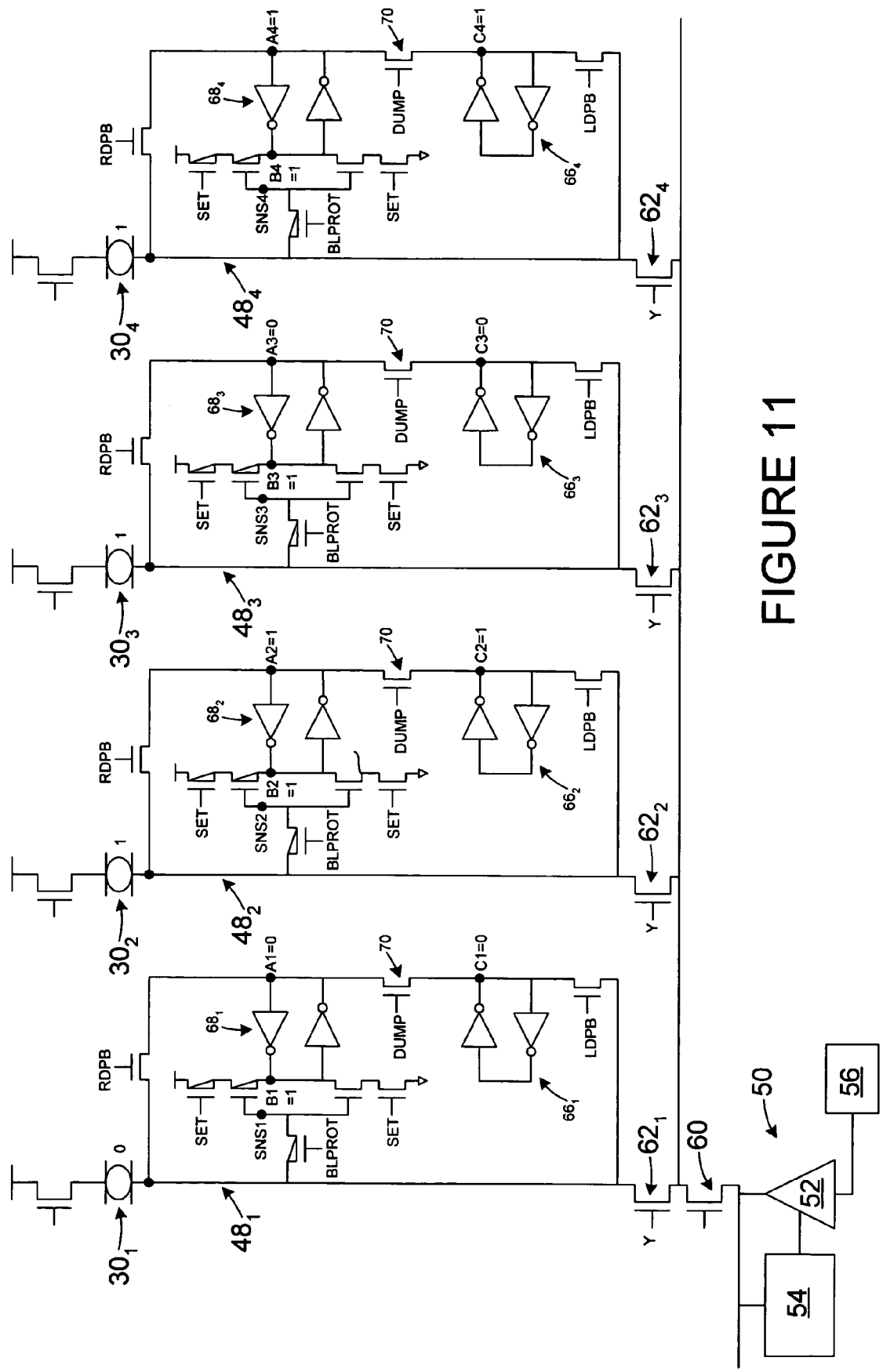

Throughout this procedure, with DUMP low, the nodes C1, C2, C3, C4 have remained in their initially set states, i.e., 0101 respectively (FIG. 11). Then, the inputs (DUMP) to the transistors 70 are simultaneously taken high, so that the information on each of the nodes C is provided its associated sense latch, so that the state of the node A of a sense latch is the same as the state of the node C of the associated data register. That is, the nodes A1, A2, A3, A4 are in the 0101 states respectively. Meanwhile, the nodes B1, B2, B3, B4 of the sense latches $68_1$, $68_2$, $68_3$, $68_4$ will each be in a state opposite to that of the associated node A, i.e., the nodes B1, B2, B3, B4 will be in the 1010 states respectively.

Figure 12:
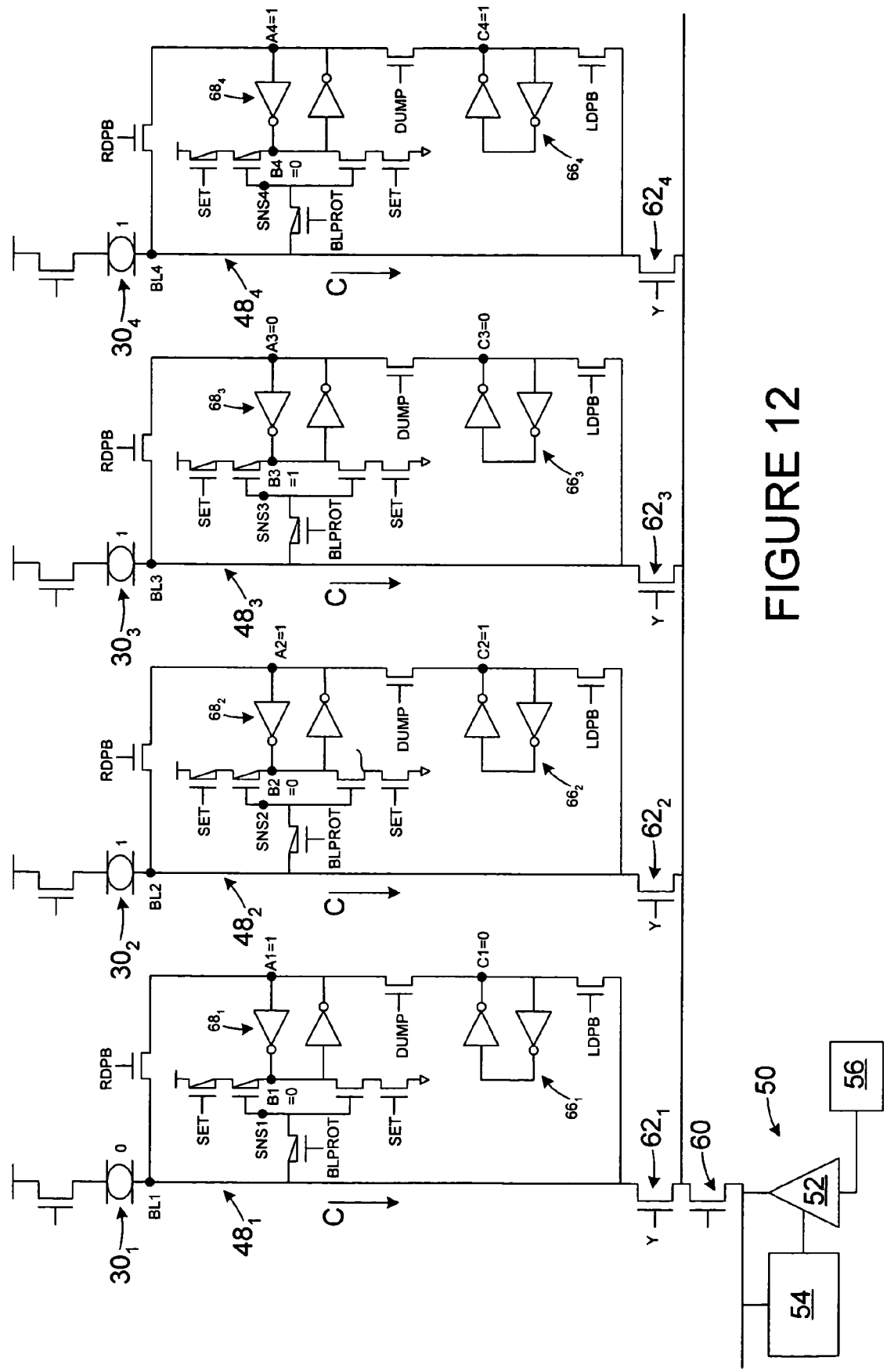
Figure 13:
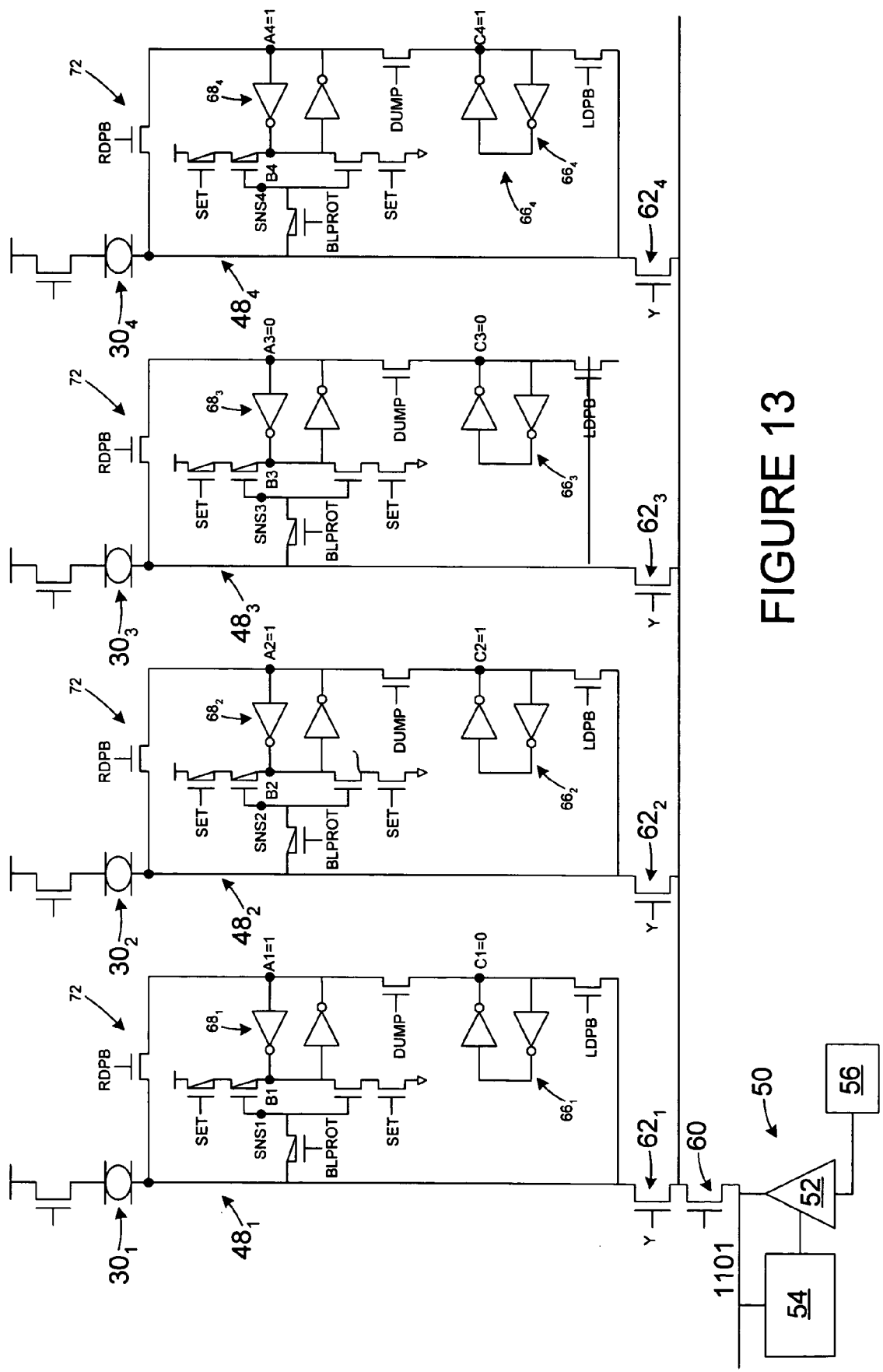

Next, and referring to FIG. 12, a program verify step is undertaken, wherein BLPROT is low, SET is high, and RDPB, DUMP, and LDPB are all low. With the y decoder transistors $62_1$, $62_2$, $62_3$, $62_4$ on, a read current is driven through each of the memory devices $30_1$, $30_2$, $30_3$, $30_4$ and, depending on the resistance thereof, the respective nodes BL1, BL2, BL3, BL4 and SNS1, SNS2, SNS3, SNS4 will be either high or low. In the particular situation illustrated, because of the low resistance of the memory device $30_1$, the node BL1 (node SNS1) will the high, while because of the high resistance of the memory devices $30_2$, $30_3$, $30_4$, the nodes BL2, BL3, BL4 and nodes SNS2, SNS3 and SNS4 will be low. In the memory structure $30_1$, with SNS1 high and SET high, the node B1 will be driven to the 0 state, in turn driving the node A1 to the 1 state. Meanwhile, the nodes B2, B3 and B4 will remain in their 010 states respectively.

Figure 14:
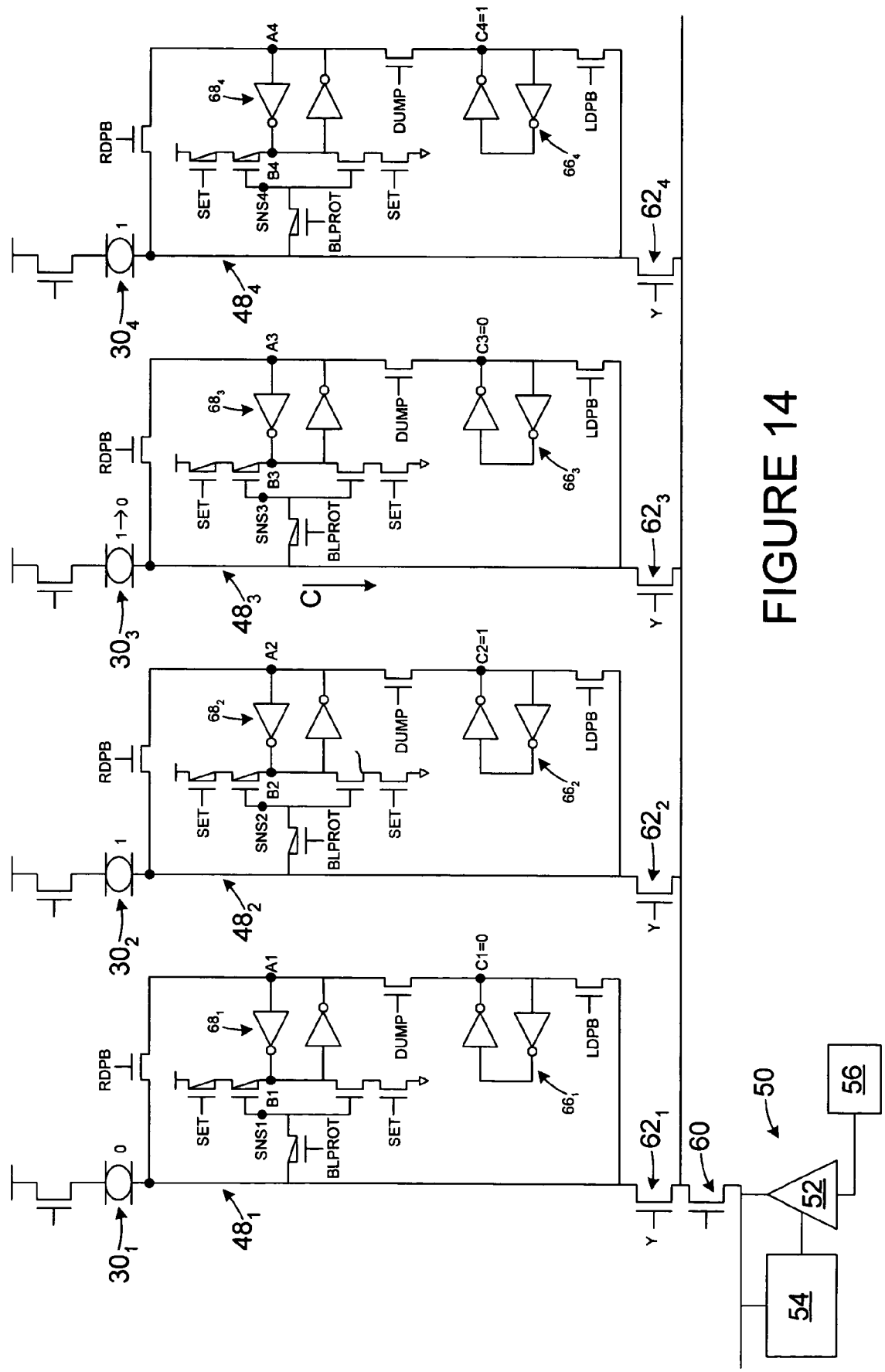
Figure 15:
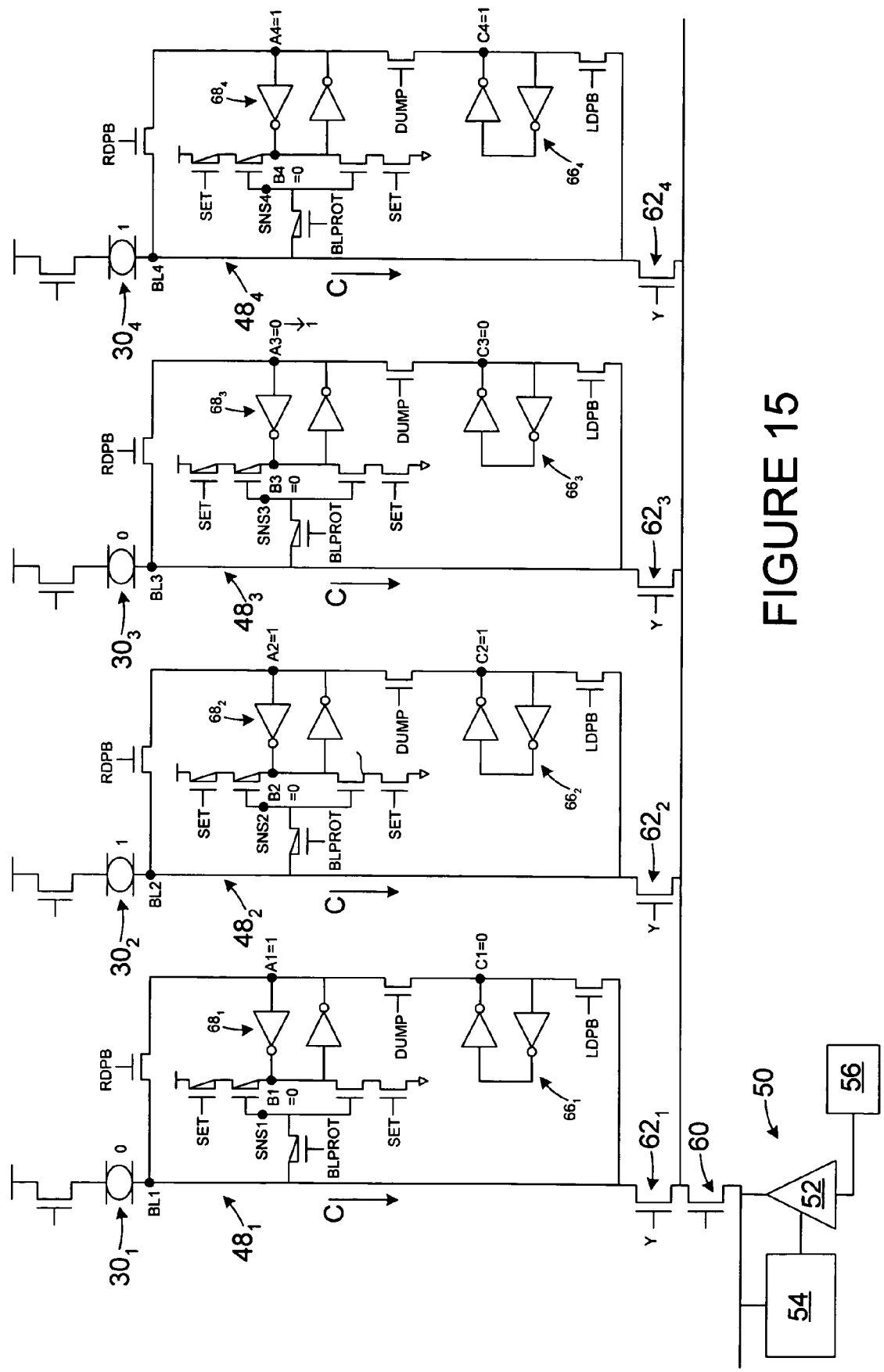

Next (FIGS. 13 and 14), the signal RDPB is driven high, turning the transistors $72_1$, $72_2$, $72_3$, $72_4$ on, so that the information at node A of each memory structure is communicated successively through Y decoder transistors $62_1$, $62_2$, $62_3$, $62_4$ to the logic 54 in the series 1101. The logic 54 provides information to the write driver to program only those memory devices wherein the state of the associated node A is 0. In this case, this is only the memory device $30_3$. Then, with only the Y decoder transistor $62_3$ on, high current is driven by the write driver 52 through the memory device $30_3$ in the proper direction to provide programming of that memory device $30_3$. As illustrated in FIG. 14, through this operation, the state of the memory device $30_3$ changes from 1 (high resistance) to 0 (low resistance). Meanwhile, the states of the memory devices $30_1$, $30_2$, $30_4$ remained unchanged, so that the states of the memory devices $30_1$, $30_2$, $30_3$, $30_4$ are now respectively 0101, corresponding to the initially provided data.

Finally, to complete the programming procedure, another program verification step (FIG. 15) is undertaken wherein BLPROT is low, SET is high, and RDPB, DUMP, and LDPB are all low. With the y decoder transistors $62_1$, $62_2$, $62_3$, $62_4$ on, a read current is driven through each of the memory devices $30_1$, $30_2$, $30_3$, $30_4$ and, depending on the resistance thereof, the respective nodes SNS will be either high or low. Because of the low resistance of the memory devices $30_1$, $30_3$, the nodes BL1, BL3 and nodes SNS1, SNS3 will the high, while because of the high resistance of the memory devices $30_2$, $30_4$, the nodes BL2, BL4 and nodes SNS2 and SNS4 will be low. Node B3 will be driven low, driving node A3 high. All of the nodes A will be in their high state, which information, when provided to the logic circuit, confirms that programming as desired has been achieved.

As described above, and as illustrated in FIG. 4, the entire process takes place in response to a single command. This is to be contrasted with the prior art, wherein a two-command approach is undertaken, i.e., wherein, upon a first command, a whole page of data is erased, and then upon a second command data is written into the array. In addition, it will be seen that erasing and programming is undertaken on only those the memory devices wherein a change of state is required from the previous state, i.e., those memory devices whose state is not to be changed from the previous state are left in that state and do not undergo an erase or program operation. Clearly these approaches greatly increase the efficiency of the programming and erasing of memory devices and reduce power requirements. Furthermore, this method provides the high currents required for programming and erasing the devices.

While the present approach is readily applicable to ion motion resistive memory devices of the type described above in the Background Art, it will be understood that the present approach is applicable to a wide variety of memory devices, including electronic switching resistive memory devices.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of undertaking a procedure on a resistive memory device comprising:
   providing data information to a data register;
   providing data information from the data register to a latch; and
   providing information from the latch to a write driver, the information provided from the latch to the write driver relating to writing data in the memory device.

2. The method of claim 1 and further comprising the write driver writing data in the memory device.

3. The method of claim 2 wherein the writing of data by the write driver changes the resistance of the memory device from a lower to a higher state.

4. The method of claim 3 and further comprising verifying the higher resistance state of the memory device.

5. The method of claim 2 wherein the writing of data by the write driver changes the resistance of the memory device from a higher to a lower state.

6. The method of claim 5 and further comprising verifying the lower resistance state of the memory device.

7. The method of claim 1 wherein, based on the information provided from the latch to the write driver, data is not written in the memory device by the write driver.

* * * * *